(12) United States Patent
Kar et al.

(10) Patent No.: US 9,746,385 B2
(45) Date of Patent: Aug. 29, 2017

(54) SYSTEM AND METHOD FOR MEASURING VARYING PARAMETERS USING ADAPTIVE SIGNAL CONDITIONING

(71) Applicant: Honeywell International, Inc., Morristown, NJ (US)

(72) Inventors: Chinmaya Kar, Karnataka (IN); Christober Vinoth Raj, Karnataka (IN); Vijendran Gopalan Venkoparao, Karnataka (IN); Neil Freeman, Perth (AU); Chirag Solanki, Karnataka (IN); Vishwanath Raghavendra Chamarajanagar, Karnataka (IN)

(73) Assignee: HONEYWELL INTERNATIONAL INC., Morristown, NJ (US)

( * ) Notice: Subject to any disclaimer, the term of this patent is extended or adjusted under 35 U.S.C. 154(b) by 205 days.

(21) Appl. No.: 13/916,410

(22) Filed: Jun. 12, 2013

(65) Prior Publication Data

US 2014/0368188 A1    Dec. 18, 2014

(51) Int. Cl.
*G01R 29/22* (2006.01)
*G01L 1/16* (2006.01)
(Continued)

(52) U.S. Cl.
CPC ............. *G01L 1/16* (2013.01); *G01H 11/08* (2013.01); *H01L 41/042* (2013.01)

(58) Field of Classification Search
CPC ........ G01R 35/005; H03G 7/00; H03G 3/004; H03G 3/007; H03G 3/008; H03G 3/20; H03G 3/3005; H03G 3/301; H04B 15/00; H04L 27/08; B65G 43/00; B65G 15/00; B65G 47/10; B65G 43/02; G01N 27/00; G01N 27/04; G01N 27/20; G01N 29/043; G01N 29/40; G01N 29/42; G01N 29/27; G01N 29/36; G01L 1/16; G01L 1/205; G01L 5/00; G01L 5/0047; G01L 5/0085; G01H 11/08; G01H 11/06; H01L 41/042; H01L 41/113; H01L 41/1132; G01D 5/12; G01D 5/14; G01D 5/24; G01D 5/241;
(Continued)

(56) References Cited

U.S. PATENT DOCUMENTS

3,733,553 A * 5/1973 Magnante ................. G01S 1/02
 375/316
4,048,573 A * 9/1977 Evans ..................... H03G 3/301
 330/136
(Continued)

*Primary Examiner* — Arleen M Vazquez
*Assistant Examiner* — Steven Yeninas (57) ABSTRACT

A method includes receiving a signal associated with one or more sensors. The method also includes examining one or more parameters of a signal conditioning circuit to determine whether clipping of the signal has occurred. The method further includes, upon a determination that clipping of the signal has occurred, decreasing a gain of the signal conditioning circuit. In addition, the method includes, upon a determination that clipping of the signal has not occurred, determining whether a cut-off frequency of the signal conditioning circuit is within a range of a frequency response of an object measured by the one or more sensors. The method can further include changing the cut-off frequency of the signal conditioning circuit and increasing a resistance or a capacitance of the signal conditioning circuit.

20 Claims, 6 Drawing Sheets

(51) Int. Cl.
*G01H 11/08* (2006.01)
*H01L 41/04* (2006.01)

(58) Field of Classification Search
CPC .... G01D 5/2417; G01D 18/00; G01D 18/004;
G01P 15/00; G01P 15/001; G01P 15/003;
G01P 15/005; G01P 15/02; G01P 15/08;
H03H 9/02244; H03H 9/02393; H03H
9/02409; H03M 1/18; H03M 1/181;
H03M 1/183
USPC ....... 324/109, 507, 76.12, 76.13, 76.19, 115,
324/605, 606, 707; 381/106, 94.8;
198/856, 502.1, 502.4, 572,
198/810.01–810.04, 340, 341.01, 341.08,
198/341.09, 571, 573; 375/344, 345,
375/316; 455/240.1, 245.1, 250.1;
702/33, 34, 35, 39, 56, 189, 190, 191,
702/193, 41, 42, 43, 44, 69, 106, 107;
73/579; 327/39–99, 306, 308, 309, 310,
327/311, 312, 315, 316, 323, 331, 332;
330/254, 278, 282, 284
See application file for complete search history.

(56) References Cited

U.S. PATENT DOCUMENTS

| | | | | |
|---|---|---|---|---|
| 4,318,053 A * | 3/1982 | Sondermeyer | ........... | H03G 1/04 330/2 |
| 4,358,742 A * | 11/1982 | Ferriss | ...................... | H03L 5/00 331/108 D |
| 4,470,120 A * | 9/1984 | Haylett | ................... | 198/810.02 |
| 4,853,963 A * | 8/1989 | Bloy | ........................ | H04B 1/66 381/106 |
| 5,198,777 A * | 3/1993 | Masuda | ................. | G01B 7/087 324/671 |
| 5,483,691 A * | 1/1996 | Heck | ...................... | H04B 1/109 375/345 |
| 5,995,910 A * | 11/1999 | Discenzo | ........................ | 702/56 |
| 6,047,814 A * | 4/2000 | Alles et al. | ............. | 198/810.02 |
| 6,094,102 A * | 7/2000 | Chang | .................. | H03L 7/0891 327/56 |
| 6,226,322 B1 * | 5/2001 | Mukherjee | ............. | H04B 3/145 333/28 R |
| 6,459,727 B1 * | 10/2002 | Cho | ..................... | H03G 3/3052 375/222 |
| 6,668,027 B1 * | 12/2003 | Scarpa | ................... | H04B 1/406 375/345 |
| 6,781,515 B2 * | 8/2004 | Kuzik | .................... | B65G 43/02 198/810.02 |
| 7,286,060 B2 * | 10/2007 | Roberts | ................ | G10H 1/0008 330/2 |
| 7,353,937 B2 * | 4/2008 | Ziegler | ..................... | 198/810.03 |
| 7,401,515 B2 | 7/2008 | Weber | | |
| 7,673,739 B2 | 3/2010 | Freeman | | |
| 8,073,078 B2 * | 12/2011 | Kaczman | ........... | H04L 27/3863 330/250 |
| 9,093,963 B2 * | 7/2015 | Lee | ...................... | H03F 3/45076 |
| 2004/0002308 A1 * | 1/2004 | Eberle | ...................... | 455/127.2 |
| 2005/0036634 A1 * | 2/2005 | Aiso et al. | ................ | 381/106 |
| 2005/0109075 A1 * | 5/2005 | Kithil et al. | .................. | 73/12.09 |
| 2006/0098827 A1 * | 5/2006 | Paddock | .................. | G10L 21/02 381/106 |
| 2007/0109170 A1 * | 5/2007 | Mori | ...................... | H03M 1/185 341/155 |
| 2007/0224959 A1 * | 9/2007 | Hendrix | .................... | H04B 1/28 455/232.1 |
| 2007/0229152 A1 * | 10/2007 | Kosai | .................. | H03H 11/1252 330/100 |
| 2007/0248177 A1 * | 10/2007 | Michael | ............... | H03G 3/3068 375/260 |
| 2009/0035556 A1 * | 2/2009 | Shimada et al. | ............... | 428/328 |
| 2009/0142579 A1 | 6/2009 | Smith | | |
| 2010/0030492 A1 * | 2/2010 | Kar et al. | ........................ | 702/39 |
| 2010/0097152 A1 * | 4/2010 | Wang | ................... | H03H 11/1256 331/44 |
| 2010/0117734 A1 * | 5/2010 | Hurwitz | ................... | H03F 1/0277 330/253 |
| 2010/0254546 A1 * | 10/2010 | Hosomi | ........... | G11B 20/10009 381/106 |
| 2010/0273441 A1 * | 10/2010 | Dubash | .................... | H01Q 1/243 455/192.2 |
| 2014/0016511 A1 * | 1/2014 | Segev | ................... | H04W 48/16 370/255 |

* cited by examiner

SYSTEM AND METHOD FOR MEASURING VARYING PARAMETERS USING ADAPTIVE SIGNAL CONDITIONING

TECHNICAL FIELD

This disclosure relates generally to sensors for measuring parameters. More specifically, this disclosure relates to a system and method for measuring varying parameters using an adaptive signal conditioning scheme.

BACKGROUND

Piezoelectric sensors are often used for flex, touch, vibration, and shock measurements. Such devices are particularly useful in applications that demand high accuracy. However, some piezoelectric sensors may have certain disadvantages. For example, some piezoelectric sensors are suited only for particular applications or ranges of measurements. In such cases, replacement or modification of a piezoelectric sensor or the sensor's environment may be difficult or cost-prohibitive.

SUMMARY

This disclosure provides a system and method for measuring varying parameters using an adaptive signal conditioning scheme.

In a first embodiment, a method includes receiving a signal associated with one or more sensors. The method also includes examining one or more parameters of a signal conditioning circuit to determine whether clipping of the signal has occurred. The method further includes, upon a determination that clipping of the signal has occurred, decreasing a gain of the signal conditioning circuit. In addition, the method includes, upon a determination that clipping of the signal has not occurred, determining whether a cut-off frequency of the signal conditioning circuit is within a range of a frequency response of an object measured by the one or more sensors.

In a second embodiment, a system includes one or more sensors, a signal conditioning circuit coupled to the one or more sensors, and at least one processing device. The at least one processing device is configured to receive a signal associated with the one or more sensors. The at least one processing device is also configured to examine one or more parameters of the signal conditioning circuit to determine whether clipping of the signal has occurred. The at least one processing device is further configured to, upon a determination that clipping of the signal has occurred, decrease a gain of the signal conditioning circuit. The at least one processing device is still further configured to, upon a determination that clipping of the signal has not occurred, determine whether a cut-off frequency of the signal conditioning circuit is within a range of a frequency response of an object measured by the one or more sensors.

In a third embodiment, a non-transitory computer readable medium is encoded with a computer program. The computer program includes computer readable program code for receiving a signal associated with one or more sensors. The computer program also includes computer readable program code for examining one or more parameters of a signal conditioning circuit to determine whether clipping of the signal has occurred. The computer program further includes computer readable program code for, upon a determination that clipping of the signal has occurred, decreasing a gain of the signal conditioning circuit. The computer program still further includes computer readable program code for, upon a determination that clipping of the signal has not occurred, determining whether a cut-off is frequency of the signal conditioning circuit is within a range of a frequency response of an object measured by the one or more sensors.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Piezoelectric sensors are used for measurement of flex, touch, vibration, shock, and other characteristics. Such sensors are particularly useful in applications that demand high accuracy. One example of a piezoelectric sensor is a piezo-based accelerometer for use in a sensor system that measures various parameters of moving bodies. Some sensor systems incorporate signal conditioning circuits in order to make signals transmitted from the sensors available for analysis. An example of such a signal conditioning system is a charge amplifier used with a piezo-based accelerometer, where an analog coulomb output of the sensor is converted into volts using a circuit having both resistance and capacitance. In some systems, additional analog pre-processing is performed on the sensor signal, such as band pass filtering, gain, and the like. Parameters associated with the pre-processing help to condition the sensor output so as to make the signal usable for analysis. The analysis results can be used for monitoring of the condition of equipment and components in the sensor system, calculation of system energy efficiency, and so forth.

Some sensors may have certain disadvantages. For example, some sensors are designed only for specific applications or for use in specific systems. Accordingly, any deviations from the specifications of the sensor during operation may cause sensor-related issues. For example, the voltage level of a sensor is one such specification. In some environments, if the voltage is exceeded, there may be clipping of the sensor's output signal or damage to the sensor over time.

Another disadvantage of certain sensors is that the application in which the sensor is to be used may change, and thus the sensor specification has to be changed based on the application. In such a case, it may be expensive to replace the sensor or the whole system. As one example, an increase in load for a strain gauge may require replacement of the entire sensor. If the sensor is a micro-electro-mechanical system (MEMS) sensor embedded inside a system, all or a significant portion of the system may have to be replaced.

As another example, when a thin film piezoelectric sensor is applied as a thin film over a window, it can sense slight variations in pressure at the window. Likewise, sensors may be used to detect variations in pressure or changes in acceleration to help to identify defective idlers in a conveyor system. However, when relatively significant external pressures or vibrations are present, charge amplifiers used by the sensors can be knocked out of operation due to large sensor outputs. This may cause the amplifiers to temporarily saturate or clip and output signals that cannot be used for analysis.

To overcome these shortcomings, embodiments of this disclosure feature an adaptive signal conditioning circuit and system that facilitate use of the same sensor or sensor system in various applications and environments. For example, the disclosed adaptive signal conditioning circuit and system are able to adaptively compensate for abnormal variations in pressure, such as by changing one or more parameters, and thus can adapt to environmental disturbances. Some signal conditioning systems allow changes to signal conditioning parameters by selecting among different feedback capacitors, each with a different capacitance, to adjust gain sensitivity. However, fine tuning cannot be achieved with this arrangement. Thus, a signal might become attenuated more than expected due to this selective switching with limited range. In contrast, the adaptive signal conditioning circuit and system disclosed here feature a MEMS-based digital tunable capacitor that is configured to be fine-tuned in real time.

Through the disclosed adaptive signal conditioning circuit and system, a sensor can become more is generic and flexible, rather than being constrained to one particular application or environment. This reduces unnecessary time and cost to plan for changes in systems and reduces procurement and installation costs for new sensors and systems.

For ease of illustration, a conveyor belt system incorporating an idler monitoring plug is discussed below to explain the adaptive signal conditioning circuit and system. However, it will be understood that the principles of the adaptive signal conditioning circuit and system disclosed here may be used in any other suitable device or system.

Figure 1:
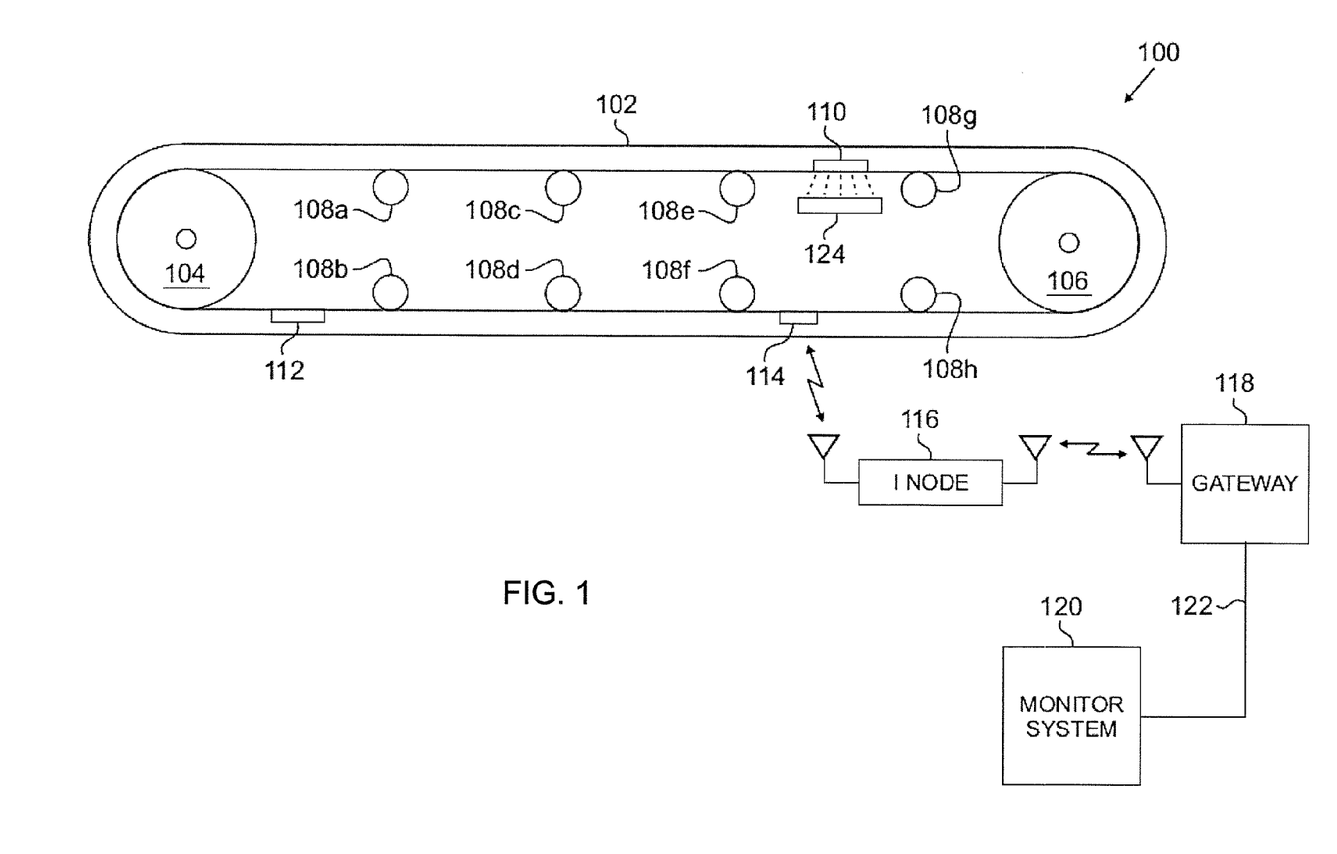
FIG. 1 illustrates an example conveyor belt system in accordance with this disclosure.

FIG. 1 illustrates an example conveyor belt system 100 in accordance with this disclosure. In this example, a conveyor belt 102 is installed around a head pulley 104 and a tail pulley 106. Between the head pulley 104 and the tail pulley 106, the belt 102 is supported by idler assemblies 108a-108h.

Idler wear or bearing failure may result in conveyor belt wear or misalignment. Idler failure may result in a torn conveyor belt with significant loss of production. In conventional conveyor belt systems, inspection of idlers may be infrequent or expensive for various reasons, such as the harshness of the conveyor belt environment, the length of the belt system, and the difficulty of inspecting idlers while the belt is in operation.

In some embodiments, wireless sensors 110, 112, 114 are embedded in the conveyor belt 102. The sensors 110, 112, 114 may be encapsulated in rubber or other material(s) as plugs and glued or fastened in other ways to the conveyor belt 102. As the sensors 110, 112, 114 pass over each of the idler assemblies 108a-108h, the sensors 110, 112, 114 sense one or more characteristics of the idler assembly and store the sensed information for later upload to a monitoring or control system. Thus, the sensors 110, 112, 114 may also be referred to as idler monitoring plugs. Uploading of stored information is performed when each sensor 110, 112, 114 comes within wireless communication range of a wireless communication node 116. The node 116 may also be referred to as an intermediate node or "i node." The node 116 is in wireless communication with a gateway node 118, which communicates with a monitoring system 120 over a communication link 122. Note, however, that one or more sensors 110, 112, 114 could also communicate directly with the gateway 118. Also, when the node 116 is not in wireless communication range of the gateway 118, additional wireless nodes may serve to relay wireless communications between the node 116 and the gateway 118.

While the conveyor belt 102 is shown with three wireless sensors in FIG. 1, more or fewer sensors may be used to provide more frequent or less frequent upload of stored information relating to idler condition. Similarly, additional nodes 116 may be installed at other locations along the conveyor belt system 100 to permit the use of sensors with smaller storage capacities or to provide failure-resistant redundant communications, as well as more frequent uploads of stored information. Also, while eight idler rollers are shown in FIG. 1, it will be understood that more or fewer idlers may be used.

The wireless sensors 110-114 can include self-contained power supplies, which may include batteries or other power supply devices. When a power supply is a battery, the battery may be selected to provide a lifetime of several years or other lengthy time period to reduce the frequency of stopping the conveyor belt in order to replace is the battery. When the power supply is a rechargeable device, a recharge terminal 124 may be provided to recharge the power supply without requiring contact with the sensors. In the embodiment shown in FIG. 1, the recharge terminal 124 utilizes inductive power transfer to recharge the power supply in the sensors.

The recharge terminal 124 can also serve as a location reference for the sensors 110-114 as they pass around the pulleys and idlers of the conveyor belt system 100. If the conveyor belt 102 rotates clockwise in FIG. 1, the idler assembly 108g can be identified as the first idler encountered after passing the recharge terminal 124. This is followed in sequence by the tail pulley 106, the idler assemblies 108h, 108f, 108d and 108b, the head pulley 104, and the idler assemblies 108a, 108c and 108e. By using the recharge terminal 124 as a location reference, the sensors 110-114 are able to identify stored information in a way that may be correctly interpreted by the monitoring system 120.

It will be understood that other location references may be provided for the sensors 110-114. For example, in other embodiments, the node 116 or other wireless device may provide a location reference. In still other embodiments, a unique spacing between idler assemblies may be recognized as a location reference.

Although FIG. 1 illustrates one example of a conveyor belt system 100, various changes may be made to FIG. 1. Various modifications to the system 100 are described above. Moreover, an adaptive signal conditioning system can be used in any suitable system, which may or may not include a conveyor belt.

Figure 2:
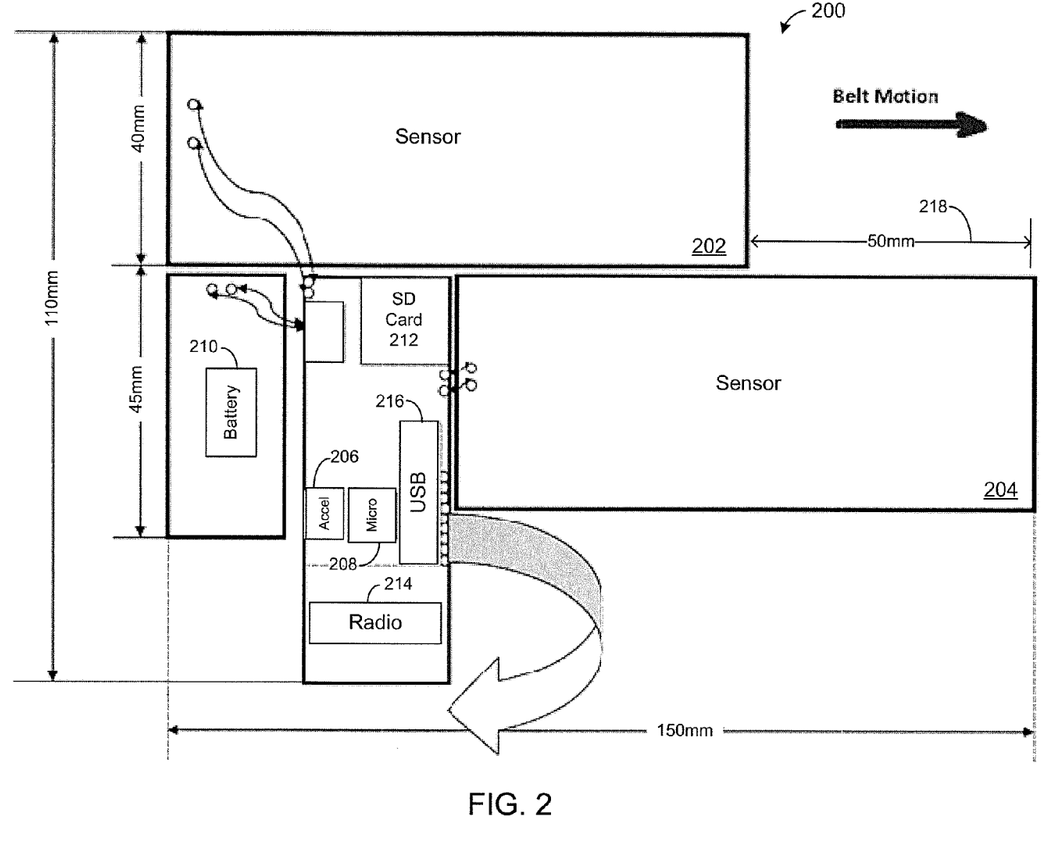
FIG. 2 illustrates an example idler monitoring plug having an arrangement of sensors in accordance with this disclosure.

FIG. 2 illustrates an example idler monitoring plug 200 having an arrangement of sensors in accordance with this disclosure. The idler monitoring plug 200 may represent one or more of the sensors 110-114 of FIG. 1. The embodiment of the idler monitoring plug 200 shown in FIG. 2 is for illustration only. Other embodiments of the idler monitoring plug 200 may be used without departing from the scope of this disclosure.

As shown in FIG. 2, the idler monitoring plug 200 includes a plurality of sensors 202, 204, 206. In some embodiments, the sensors 202, 204 could include polyvinylidene fluoride (PVDF) sensors 202, 204 and a micro-electro-mechanical system (MEMS) accelerometer 206. The PVDF sensors 202, 204 may be, for example, sensors from EMFIT, LTD. or MIROW SYSTEMTECHNIK GmbH.

The idler monitoring plug 200 also includes a microprocessor 208, a power supply like a battery 210, a memory card like an SD card 212 for temporary storage, and a radio 214 for wireless transmission, such as to the wireless node 116 in FIG. 1. The idler monitoring plug 200 also includes a USB connection 216 to physically connect the plug 200 to a computer or other data processing device, such as to store data manually, update firmware, and so forth.

The idler monitoring plug 200 is attached to or embedded in a conveyor belt, such as the conveyor belt 102 of FIG. 1. As the belt moves, the idler monitoring plug 200 moves over an idler, such as the idler assemblies 108a-108h of FIG. 1. The sensors 202-206 in the idler monitoring plug 200 detect one or more properties of the idler, such as vibration or strain. A gap 218 between the leading edges of the two PVDF sensors 202-204 is provided so that the microprocessor 208 or an adaptive signal conditioning system can determine the velocity of the belt using the difference in time of detection between the two sensors 202-204.

The properties measured by the sensors 202-206 may indicate one or more defects in an idler. The sensors 202-206 transmit measurements of the properties to the microprocessor 208. The microprocessor 208 may then wirelessly transmit the measurements or other data to a processor or controller in an adaptive signal conditioning system.

Although FIG. 2 illustrates one example of an idler monitoring plug 200 having an arrangement of sensors, various changes may be made to FIG. 2. For example, the sensors 202-206 could include other or additional types of sensors. Also, the dimensions shown in FIG. 2 may be greater or less than indicated in FIG. 2. Moreover, the makeup and arrangement of the idler monitoring plug 200 is for illustration only. Components could be added, omitted, combined, or placed in any other configuration according to particular needs.

Figure 3:
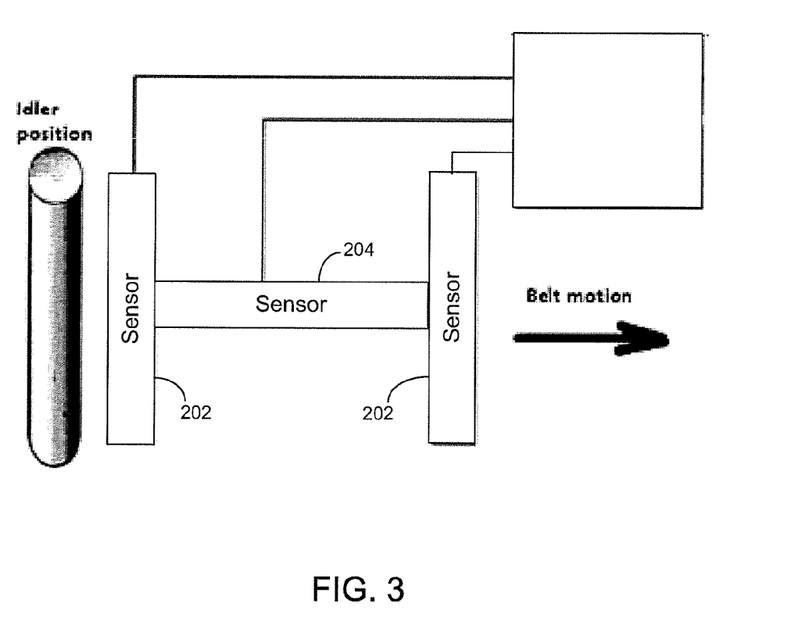
FIG. 3 illustrates another example arrangement of sensors in an idler monitoring plug in accordance with this disclosure.

FIG. 3 illustrates another example arrangement of sensors in an idler monitoring plug 200 in accordance with this disclosure. In this example, two sensors 202 are positioned parallel to an idler, and another sensor 204 is positioned perpendicular to the idler. This represents one example alternative arrangement of sensors in the plug 200, and other alternative arrangement of sensors can be used.

Figure 4A:
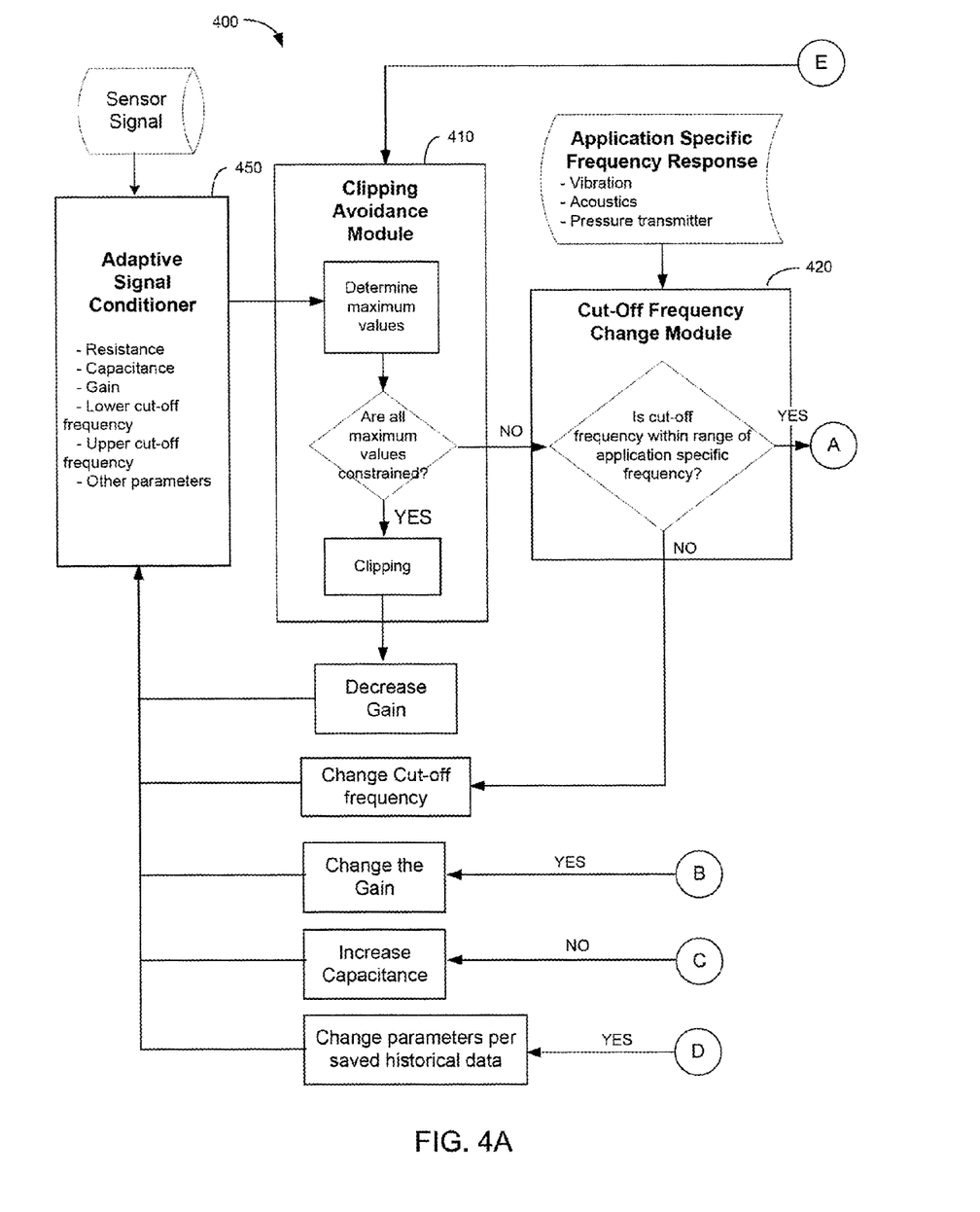
FIGS. 4A and 4B illustrate an example adaptive signal conditioning system in accordance with this disclosure.
Figure 4B:
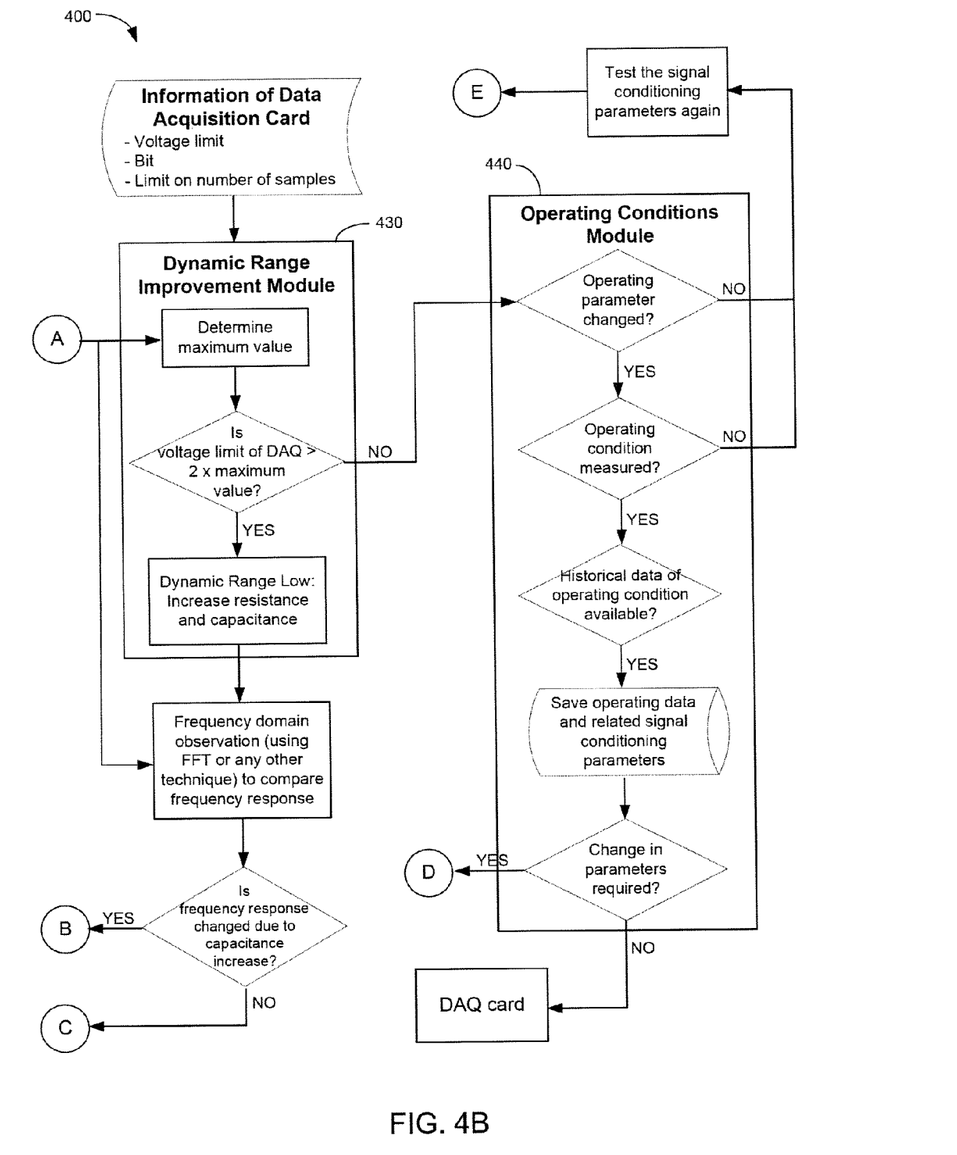

FIGS. 4A and 4B illustrate an example adaptive signal conditioning system 400 in accordance with this disclosure. The signal conditioning system 400 may be used in association with a conveyor belt system, such as the conveyor belt system 100 of FIG. 1. The signal conditioning system 400 could be used with any other system or interface.

The signal conditioning system 400 may be used is with a variety of sensors, such as high-frequency sensors (like sensors capable of measuring frequencies greater than 20 KHz). Examples of high-frequency sensors include accelerometers, microphones, and strain gauges. As a particular example, the signal conditioning system 400 may be used with the sensors 202-206 of FIG. 2.

The signal conditioning system 400 is configured to detect a change in the operating load of a sensor and adapt a corresponding sensor circuit in real-time so that the sensor is able to continue accurately measuring a load (such as without any clipping). That is, upon detection of a change in load, the adaptive system 400 changes capacitance, resistance, gain, upper frequency cut-off, lower frequency cut-off, or any other characteristic(s) in such a way that the maximum load of the sensor can be reduced or the maximum measurable value can be increased. Similarly, the signal conditioning system 400 is configured to operate with small operating loads. In some cases, the load can be very small, such as a load with a frequency that is less than 1 Hz. In such a case, the adaptive system 400 changes capacitance, resistance, gain, upper frequency cut-off, lower frequency cut-off, or any other characteristic(s) in such a way that the load (and small changes to the load) can be more easily detected.

In this example, the signal conditioning system 400 includes a clipping avoidance module 410, a cut-off frequency change module 420, a dynamic range improvement module 430, and an operating conditions module 440. These four modules cooperate to improve the signal quality of the signal from the sensor.

The clipping avoidance module 410 receives a signal from an adaptive signal conditioning circuit 450, which is coupled to a sensor. To detect clipping, the clipping avoidance module 410 examines the received signal and determines whether local maximum values (peaks) of the signal from the sensor are the same. If the clipping avoidance module 410 determines that all of the local maximum values of the signal of the sensor are the same, it is determined that clipping of the signal has occurred. If it is determined that clipping has occurred, the signal conditioning system 400 decreases the overall gain of the adaptive signal conditioning circuit 450. If it is determined that clipping has not occurred, operation of the signal conditioning system 400 moves to the cut-off frequency change module 420.

The cut-off frequency change module 420 obtains one or more application specific frequency responses, such as vibration, acoustics, or pressure, associated with a device or object to be measured. For example, an idler may have a minimum frequency of 10 Hz and a maximum frequency of 4 KHz. The cut-off frequency change module 420 then determines if the cut-off frequency of the adaptive signal conditioning circuit 450 is within the range of the obtained application specific frequency or frequencies. For instance, the cut-off frequency module 420 may determine if the upper cut-off frequency of the adaptive signal conditioning circuit 450 is less than the maximum frequency of the idler. If the cut-off frequency or frequencies of the adaptive signal conditioning circuit 450 are not within the range of the application specific frequency, the signal conditioning system 400 changes the cut-off frequency or frequencies of the adaptive signal conditioning circuit 450. If the cut-off frequency or frequencies are in range, the process moves to the dynamic range improvement module 430.

The dynamic range improvement module 430 obtains information associated with a data acquisition card (DAQ), such as the voltage limit, bit rate, or limit on the number of samples, and compares the obtained information with the signal from the sensor. In various cases, the voltage limit of the DAQ is very large, but the signal from the sensor is very low. This can be the case when the operating load of the sensor is very small.

The dynamic range improvement module 430 determines the operating load of the sensor. The dynamic range improvement module 430 determines whether the operating load of the sensor is low such that it causes the voltage of the sensor's signal to be substantially less than the voltage limit of the DAQ (such as if the voltage limit of the DAQ is more than twice the maximum voltage of the sensor). If so, it is determined that the dynamic range of the sensor is low, and the signal conditioning system 400 increases the resistance or capacitance of the adaptive signal conditioning circuit 450.

The dynamic range improvement module 430 can then observe the frequency domain (such as by using a Fast Fourier Transform or any other suitable technique) to compare the frequency response. If the frequency response changes due to the increase in capacitance, the signal conditioning system 400 changes the gain of the adaptive signal conditioning circuit 450. If the frequency response does not change (or changed only insubstantially) due to the increase in capacitance, the signal conditioning system 400 further increases the capacitance of the adaptive signal conditioning circuit 450. If the dynamic range improvement module 430 determines that the dynamic range of the sensor is not low, operation of the signal conditioning system 400 passes to the operating conditions module 440.

The operating conditions module 440 tracks and saves current operating parameters to be used as historical data at a future time. For example, the operating conditions module 440 can determine if one or more measured operating parameters associated with the sensor have changed. If it is determined that no measured parameters have changed, the operating parameters can be measured and tested again, with operation of the signal conditioning system passing back to the clipping avoidance module 410. If it is determined that one or more measured parameters have changed, the changed parameters are compared to historical data if such historical data is available. If the comparison between the measured parameters and the historical data reveals that changes to the sensor parameters are required, the signal conditioning system 400 changes the parameters according to the historical data.

If the historical data pertaining to the operating conditions and related parameters are not available, then the system determines the current operating conditions and related parameters and saves these values for future reference, thereby enriching the knowledge bank of historical database.

Although FIGS. 4A and 4B illustrate one example of an adaptive signal conditioning system 400, various changes may be made to FIGS. 4A and 4B. For example, components of the adaptive signal conditioning system 400 could be added, omitted, combined, or placed in any other configuration according to particular needs.

Figure 5:
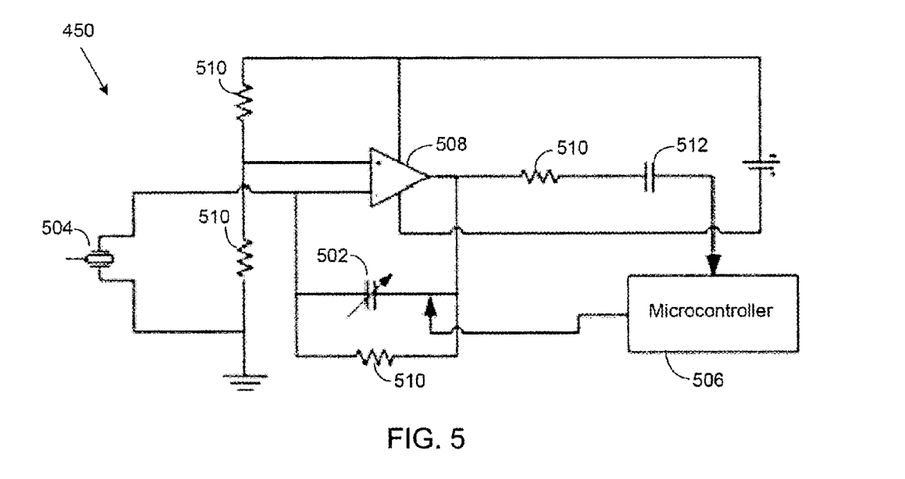
FIG. 5 illustrates an example signal conditioning circuit in accordance with this disclosure.

FIG. 5 illustrates an example signal conditioning circuit 450 in accordance with this disclosure. The signal conditioning circuit 450 is capable of being tuned using the adaptive signal conditioning system 400 of FIGS. 4A and 4B and may be used in association with one or more sensors, such as the sensors 202-206 of FIG. 2. The signal conditioning circuit 450 could be used with any other system or sensor.

As shown in FIG. 5, the signal conditioning circuit 450 includes a tunable MEMS-based capacitor 502, one or more sensors 504, a microcontroller 506, a charge amplifier 508, and a plurality of other resistive and capacitive elements 510, 512. The capacitance of the MEMS capacitor 502 can be changed in real-time while the signal conditioning circuit 450 is operating. This change can be based on monitoring or measurements of various parameters or conditions, such as load, cutoff response, and clipping. If values are not in a desired range, the microcontroller 506 controls the capacitor 502 to change its capacitance. A change in the capacitance results in a corresponding change in the output of the signal conditioning circuit 450 so that the output is ideally in a desired range. For example, changes to the tunable capacitor 502 can result in changes to the gain and cutoff frequency range.

Although FIG. 5 illustrates one example of a signal conditioning circuit 450, various changes may be made to FIG. 5. For example, other implementations of the signal conditioning circuit 450 could be used. Also, the makeup and arrangement of the signal conditioning circuit 450 is for illustration only. Components could be added, omitted, combined, or placed in any other configuration according to particular needs.

Figure 6:
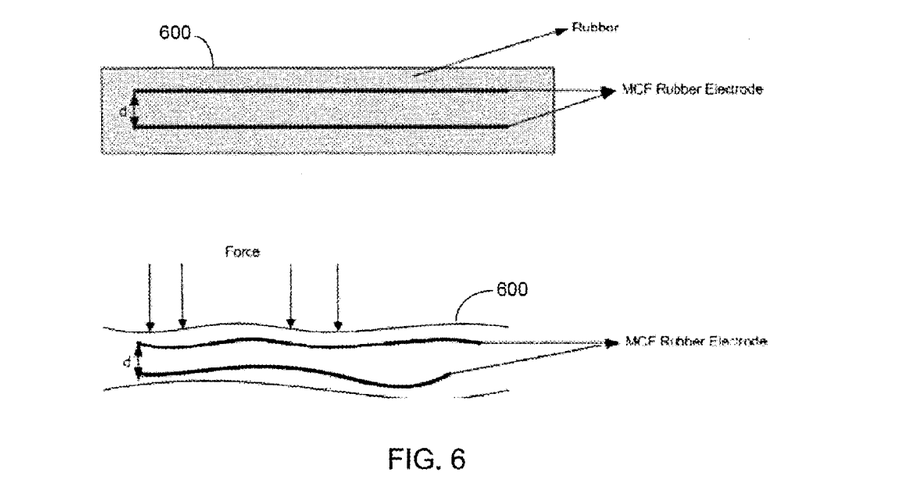
FIG. 6 illustrates an example tunable capacitor configured with a magnetic compound fluid (MCF) rubber electrode in accordance with this disclosure.

FIG. 6 illustrates a tunable capacitor 600 configured with a magnetic compound fluid (MCF) rubber electrode in accordance with this disclosure. This tunable capacitor 600 could be used as the tunable MEMS-based capacitor 502 in FIG. 5.

As shown in FIG. 6, the capacitor 600 could be configured with magnetic compound fluid (MCF) rubber as an electrode on either side of a dielectric material (such as rubber or glass). The capacitance is changed if a load over the electrode causes deformation in a gap "d." For example when the gap "d" decreases, the capacitance increases.

Although FIG. 6 illustrates one example of a tunable capacitor 600 configured with an MCF rubber electrode, various changes may be made to FIG. 6. For example, other types of capacitors could be used in the signal conditioning circuit 450.

The embodiments disclosed in this document provide a solution for an adaptive signal conditioning system that measures and changes various parameters or combinations of parameters. Example parameters include resistance, capacitance, gain, lower cut-off frequency, higher cut-off frequency, and any other parameter(s) that may depend on sensor characteristics. The adaptive signal conditioning system is capable of changing parameters in real time with any change in operating conditions of the system that it measures. The disclosed embodiments are flexible and capable of being applied to various applications.

In some embodiments, various functions described above are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The terms "transmit," "receive," and "communicate," as well as derivatives thereof, encompass both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "controller" means any device, system, or part thereof that controls at least one operation. A controller may be implemented in hardware or a combination of hardware and software/firmware. The functionality associated with any particular controller may be centralized or distributed, whether locally or remotely. The phrase "at least one of," when used with a list of items, means that different combinations of one or more of the listed items is may be used, and only one item in the list may be needed. For example, "at least one of: A, B, and C" includes any of the following combinations: A, B, C, A and B, A and C, B and C, and A and B and C.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
receiving, by at least one processing device, a signal associated with a measurement of a property of an object by one or more sensors disposed in a belt of a conveyor belt system;
examining, by the at least one processing device, one or more parameters of a signal conditioning circuit to determine whether clipping of the signal has occurred, the signal conditioning circuit comprising a micro-electro-mechanical system (MEMS) based capacitor, a charge amplifier and a second capacitor electrically coupled to the MEMS based capacitor, and at least one resistor in parallel with the MEMS based capacitor;
upon a determination that clipping of the signal has occurred, changing, by the at least one processing device, a capacitance of the MEMS based capacitor to decrease a gain of the signal conditioning circuit;
upon a determination that clipping of the signal has not occurred, determining, by the at least one processing device, whether a cut-off frequency of the signal conditioning circuit is within a range of a frequency response of the object measured by the one or more sensors;
upon a determination that the cut-off frequency of the signal conditioning circuit is not within the range of the frequency response, changing, by the at least one processing device, the capacitance of the MEMS based capacitor to change the cut-off frequency of the signal conditioning circuit;
upon a determination that the cut-off frequency of the signal conditioning circuit is within the range of the frequency response, determining, by the at least one processing device, whether a voltage of the signal indicates that a dynamic range of the one or more sensors is low; and
upon a determination that the voltage of the signal indicates that the dynamic range of the one or more sensors is low, increasing, by the at least one processing device, a resistance or a capacitance of the signal conditioning circuit.

2. The method of claim 1, wherein determining whether the voltage of the signal indicates that the dynamic range of the one or more sensors is low comprises determining whether the voltage of the signal is substantially less than a voltage limit of a data acquisition card (DAQ).

3. The method of claim 1, wherein the one or more parameters comprise at least one of: a resistance, a capacitance, a gain, a lower cut-off frequency, and an upper cut-off frequency.

4. The method of claim 1, wherein the MEMS based capacitor comprises a magnetic compound fluid (MCF) electrode.

5. The method of claim 1, wherein the one or more sensors are disposed in a plug inserted in the belt of the conveyor belt system, and the property of the object measured by the one or more sensors comprises a property of an idler in the conveyor belt system.

6. The method of claim 1, wherein the one or more sensors comprise a polyvinylidene fluoride (PVDF) sensor and an accelerometer.

7. The method of claim 1, further comprising:
upon a determination that the voltage of the signal indicates that the dynamic range of the one or more sensors is not low, determining whether an operating parameter associated with the one or more sensors has changed; and
upon a determination that the operating parameter associated with the one or more sensors has changed, changing the operating parameter according to historical data associated with the operating parameter.

8. A system comprising:
one or more sensors configured to be disposed in a belt of a conveyor belt system;
a signal conditioning circuit coupled to the one or more sensors, the signal conditioning circuit comprising a micro-electro-mechanical system (MEMS) based capacitor, a charge amplifier and a second capacitor electrically coupled to the MEMS based capacitor, and at least one resistor in parallel with the MEMS based capacitor; and
at least one processing device configured to:
receive a signal associated with a measurement of a property of an object by the one or more sensors;
examine one or more parameters of the signal conditioning circuit to determine whether clipping of the signal has occurred;
upon a determination that clipping of the signal has occurred, change a capacitance of the MEMS based capacitor to decrease a gain of the signal conditioning circuit;
upon a determination that clipping of the signal has not occurred, determine whether a cut-off frequency of the signal conditioning circuit is within a range of a frequency response of the object measured by the one or more sensors;

upon a determination that the cut-off frequency of the signal conditioning circuit is not within the range of the frequency response, change the capacitance of the MEMS based capacitor to change the cut-off frequency of the signal conditioning circuit;

upon a determination that the cut-off frequency of the signal conditioning circuit is within the range of the frequency response, determine whether a voltage of the signal indicates that a dynamic range of the one or more sensors is low; and upon a determination that the voltage of the signal indicates that the dynamic range of the one or more sensors is low, increase a resistance or a capacitance of the signal conditioning circuit.

9. The system of claim 8, wherein, to determine whether the voltage of the signal indicates that the dynamic range of the one or more sensors is low, the at least one processing device is configured to determine whether the voltage of the signal is substantially less than a voltage limit of a data acquisition card (DAQ).

10. The system of claim 8, wherein the one or more parameters comprise at least one of: a resistance, a capacitance, a gain, a lower cut-off frequency, and an upper cut-off frequency.

11. The system of claim 8, wherein the MEMS based capacitor comprises a magnetic compound fluid (MCF) electrode.

12. The system of claim 8, wherein the one or more sensors are disposed in a plug configured to be inserted in the belt of the conveyor belt system, and the property of the object measured by the one or more sensors comprises a property of an idler in the conveyor belt system.

13. The system of claim 8, wherein the one or more sensors comprise a polyvinylidene fluoride (PVDF) sensor and an accelerometer.

14. The system of claim 8, wherein the at least one processing device is further configured to:
upon a determination that the voltage of the signal indicates that the dynamic range of the one or more sensors is not low, determine whether an operating parameter associated with the one or more sensors has changed; and
upon a determination that the operating parameter associated with the one or more sensors has changed, change the operating parameter according to historical data associated with the operating parameter.

15. A non-transitory computer readable medium containing a computer program, the computer program comprising computer readable program code that when executed causes at least one processing device to:
receive a signal associated with a measurement of a property of an object by one or more sensors disposed in a belt of a conveyor belt system;
examine one or more parameters of a signal conditioning circuit to determine whether clipping of the signal has occurred, the signal conditioning circuit comprising a micro-electro-mechanical system (MEMS) based capacitor, a charge amplifier and a second capacitor electrically coupled to the MEMS based capacitor, and at least one resistor in parallel with the MEMS based capacitor;

upon a determination that clipping of the signal has occurred, change a capacitance of the MEMS based capacitor to decrease a gain of the signal conditioning circuit;

upon a determination that clipping of the signal has not occurred, determine whether a cut-off frequency of the signal conditioning circuit is within a range of a frequency response of the object measured by the one or more sensors;

upon a determination that the cut-off frequency of the signal conditioning circuit is not within the range of the frequency response, change the capacitance of the MEMS based capacitor to change the cut-off frequency of the signal conditioning circuit;

upon a determination that the cut-off frequency of the signal conditioning circuit is within the range of the frequency response, determine whether a voltage of the signal indicates that a dynamic range of the one or more sensors is low; and upon a determination that the voltage of the signal indicates that the dynamic range of the one or more sensors is low, increase a resistance or a capacitance of the signal conditioning circuit.

16. The non-transitory computer readable medium of claim 15, wherein the computer readable program code that when executed causes the at least one processing device to determine whether the voltage of the signal indicates that the dynamic range of the one or more sensors is low comprises:
computer readable program code that when executed causes the at least one processing device to determine whether the voltage of the signal is substantially less than a voltage limit of a data acquisition card (DAQ).

17. The non-transitory computer readable medium of claim 15, wherein the one or more parameters comprise at least one of: a resistance, a capacitance, a gain, a lower cut-off frequency, and an upper cut-off frequency.

18. The non-transitory computer readable medium of claim 15, wherein the MEMS based capacitor comprises a magnetic compound fluid (MCF) electrode.

19. The non-transitory computer readable medium of claim 15, wherein the one or more sensors are disposed in a plug inserted in the belt of the conveyor belt system, and the property of the object measured by the one or more sensors comprises a property of an idler in the conveyor belt system.

20. The non-transitory computer readable medium of claim 15, further containing computer readable program code that when executed causes the at least one processing device to:
upon a determination that the voltage of the signal indicates that the dynamic range of the one or more sensors is not low, determine whether an operating parameter associated with the one or more sensors has changed; and
upon a determination that the operating parameter associated with the one or more sensors has changed, change the operating parameter according to historical data associated with the operating parameter.

* * * * *